(12) United States Patent
Zeller (10) Patent No.: US 11,333,733 B2
(45) Date of Patent: May 17, 2022

(54) METHOD AND APPARATUS FOR RECORDING A MAGNETIC RESONANCE DATA RECORD

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 61 days.

(21) Appl. No.: 16/280,372

(22) Filed: Feb. 20, 2019

(65) Prior Publication Data

US 2019/0257906 A1 Aug. 22, 2019

(30) Foreign Application Priority Data

Feb. 20, 2018 (EP) ..................................... 18157647

(51) Int. Cl.
*G01R 33/561* (2006.01)
*G01R 33/48* (2006.01)
*G01R 33/483* (2006.01)

(52) U.S. Cl.
CPC ..... *G01R 33/5616* (2013.01); *G01R 33/4828* (2013.01); *G01R 33/4835* (2013.01); *G01R 33/5611* (2013.01)

(58) Field of Classification Search
CPC ............ G01R 33/4828; G01R 33/4835; G01R 33/5611; G01R 33/5616; G01R 33/4818; G01R 33/5615; G01R 33/56554
See application file for complete search history.

(56) References Cited

U.S. PATENT DOCUMENTS

| | | | | |
|---|---|---|---|---|
| 5,742,163 | A | * 4/1998 | Liu | .................. G01R 33/56554 324/307 |
| 6,400,151 | B1 | * 6/2002 | Haase | .................. G01R 33/482 324/307 |
| 9,664,762 | B2 | * 5/2017 | Banerjee | ............ G01R 33/4836 |

(Continued)

FOREIGN PATENT DOCUMENTS

WO WO-2015/152957 A1 10/2015

OTHER PUBLICATIONS

Bilgic et al.: "Calibrationless Parallel Imaging in Multi Echo/Contrast Data"; http://marlinos.org/~berkin/0139.html; vol. 0139; pp. 1-2; (2017).
Cho et al. "Correction of Chemical-Shift Ghost Artifact in Blipped Controlled Aliasing Parallel Imaging": Proceedings Of The International Society For Magnetic Resonance In Medicine; ISMRM: 24th Annual Meeting and Exhibition; Singapore; May 7-13, 2016; No. 610;(2016).

(Continued)

Primary Examiner — Steven L Yeninas
(74) *Attorney, Agent, or Firm* — Banner & Witcoff Ltd.

(57) ABSTRACT

In a method and apparatus for recording a magnetic resonance (MR) data record using multiple reception coils, the data of the MR data record contain measurement signals of at least two image data records respectively from at least two slices. The MR data record is acquired in a sequence having an excitation phase, an evolution phase, readout of a first echo signal while a first read gradient is being applied, application of at least one shift gradient in a slice-selection direction, and readout of at least one further echo signal while a further read gradient is applied. The shift gradient is positioned so as to cause a shift of at least one further image data record generated from the further echo signal or signals relative to the first image data record generated from first echo signals.

15 Claims, 9 Drawing Sheets

(56) References Cited

U.S. PATENT DOCUMENTS

| | | | | |
|---|---|---|---|---|
| 10,613,175 | B2* | 4/2020 | Feiweier | G01R 33/4835 |
| 2009/0177078 | A1* | 7/2009 | Takizawa | A61B 5/055 |
| | | | | 600/415 |
| 2014/0285195 | A1* | 9/2014 | Stemmer | G01R 33/4818 |
| | | | | 324/309 |
| 2015/0355303 | A1* | 12/2015 | Kuhara | G01R 33/5611 |
| | | | | 324/322 |
| 2017/0089999 | A1* | 3/2017 | Zeller | G01R 33/56563 |
| 2017/0276755 | A1* | 9/2017 | Hoge | G01R 33/5616 |
| 2017/0328971 | A1* | 11/2017 | Bilgic | G01R 33/5617 |
| 2018/0095143 | A1 | 4/2018 | Zeller | |
| 2018/0313927 | A1 | 11/2018 | Zeller | |
| 2019/0049541 | A1* | 2/2019 | Carinci | A61B 5/055 |
| 2019/0094321 | A1* | 3/2019 | Carinci | G01R 33/5611 |
| 2019/0369186 | A1* | 12/2019 | Setsompop | G01R 33/565 |
| 2019/0369199 | A1* | 12/2019 | Setsompop | G01R 33/5616 |
| 2020/0088822 | A1* | 3/2020 | Jurrissen | G01R 33/56545 |

OTHER PUBLICATIONS

Norris et al. "Application Of PINS Radiofrequency Pulses To Reduce Power Deposition In RARE/Turbo Spin Echo Imaging Of The Human Head" Magnetic Resonance in Med, vol. 71: 44-49; (2014).

Setsompop et al.: "Blipped-Controlled Aliasing in Parallel Imaging for Simultaneous Multislice Echo Planar Imaging with Reduced g-Factor Penalty";: Magnetic Resonance in Medicine; vol. 67; pp. 1210-1224; (2012).

Bilgic et al.: "Joint Bayesian Compressed Sensing with Prior Estimate"; in: Proc. Intl. Soc. Mag. Reson. Med; vol. 20; p. 75; (2012).

Dai et al.: "Simultaneous Multislice Accelerated Interleaved EPI DWI Using Generalized Blipped-CAIPI Acquisition and 30 K-space Reconstruction: SMS Accelerated, iEPI DWI"; Magnetic Resonance In Medicine; vol. 77; No. 4; pp. 1593-1605; (2018).

* cited by examiner

METHOD AND APPARATUS FOR RECORDING A MAGNETIC RESONANCE DATA RECORD

BACKGROUND OF THE INVENTION

Field of the Invention

The present invention concerns a method and an apparatus for recording (acquiring) a magnetic resonance (MR) data record, by operation of an MR data acquisition scanner having multiple radio-frequency (RF) reception coils.

Description of the Prior Art

In magnetic resonance tomography, image data are obtained by recording spatially encoded radio-frequency signals, the radio-frequency signals having to be processed by a Fourier transformation so that they are available as an image data record.

Magnetic resonance tomography has the advantage over CT and X-ray that it does not require any X-ray radiation. However, especially in the early stages, it did require substantial measurement times of in the region of 5 minutes and more for the measurement of a single image.

The first step toward shortening the data acquisition time was to accelerate the basic spin echo and gradient echo measurement sequences. In the case of gradient echoes, it was possible to achieve acceleration by reducing the flip angle and thereby being able to shorten the repetition time. Sequences of this type are known under the acronym FLASH (Fast Low Angle SHot).

In the case of EPI (Echo Planar Imaging) a gradient echo train is recorded.

An echo train is likewise recorded in order to accelerate a spin echo. In this case, however, RF refocusing pulses rather than gradients are used for refocusing. These are known under the acronyms TSE (Turbo Spin Echo), FSE (Fast Spin Echo) or RARE (Rapid Acquisition with Relaxation Enhancement).

These sequences bring the measurement times for an image data record into the range of seconds to parts of a minute. Further acceleration was then necessary in order, for example, to increase the signal-noise ratio, for 3D-image data records and for functional imaging.

This was achieved by techniques known as parallel imaging. This is a collective term for various recording and methods. These all have in common the fact that the measurement data are recorded simultaneously using multiple reception coils. A reduction in the measurement time is achieved by the fact that only some of the k-space lines are recorded (filled with data) using multiple coils.

The data of each individual coil are undersampled, which causes an image defect known as an aliasing artefact (folding). To prevent such folding, there are several procedures that are used:

In GRAPPA (GeneRalized Autocalibrating Partially Parallel Acquisition), the missing k-space lines are reconstructed in k-space. In the process, one k-space line is determined from multiple measured k-space lines.

In SENSE (SENSitivity Encoding for fast MRI), the image data of the individual coils are used to determine an unfolded image. Sensitivity maps of the coils are also taken into account.

In the methods described, the unfolding always involves differences in the sensitivity of the measurement coils. To emphasize the differences, there are known methods under the acronym CAIPIRINHA (Controlled Aliasing In Parallel Imaging Results IN Higher Acceleration). These are not reconstruction methods but modifications of known measurement sequences.

In MS-CAIPIRINHA, an alternating dual-band pulse is used to excite two slices. 2D-CAIPIRINHA is based on improving sensitivity variations in three-dimensional imaging.

The sensitivity changes generated by the CAIPIRINHA methods must then be taken into account in the sensitivity matrices. Reconstruction methods such as GRAPPA or SENSE can otherwise be used unchanged.

The parallel imaging methods can also be used in order to obtain measurement data for a Dixon method, namely 2-point Dixon or 3-point Dixon. As is known, these are used in order to calculate a pure water image and a pure fat image from two or three image data records.

Here, echoes are acquired in which the water protons and the fat protons are oriented once "in phase", i.e. in the same direction, and once or twice in "opposed phase", i.e. in opposing phase. In spin-echo-based sequences, too, a gradient echo train is normally used to generate the two or three echoes of the two or three image data records. In this case, an "opposed phase" echo, an "in phase" echo and possibly a further "opposed phase" echo alternate.

This gradient echo train can also be integrated into a fast spin echo sequence. A gradient echo train of this kind is then generated and recorded after each refocusing pulse. The k-space lines of the echoes correspond to one another, and the slice arrangement is also identical. This means that for each image the identical slice or slices of the same k-space line position are recorded in the phase direction.

If multiple coils are used, and in particular if CAIPIRINHA methods are used to increase sensitivity, problems can occur during data reconstruction.

SUMMARY OF THE INVENTION

An object of the present invention is to provide a method for recording MR measurement data that permits later separation of water and fat protons, and that allows parallel imaging and in particular CAIPIRINHA methods, and wherein the reconstruction of the image data to be generated is improved.

This object is achieved by a method for recording a magnetic resonance data record using multiple RF reception coils, the measurement signals of the magnetic resonance data record containing measurement signals of at least two image data records from at least two slices, respectively. The method includes:
 a) an excitation phase,
 b) an evolution phase,
 c) a detection phase that includes:
 c1) readout of a first echo signal while a first read gradient is being applied,
 c2) application of at least one shift gradient in a slice-selection direction, and
 c3) readout of at least one further echo signal while a further read gradient is being applied,
 c4) the shift gradient being positioned such that it causes a shift of at least one further image data record generated from the further echo signal or signals relative to the first image data record generated from first echo signals.

The basis of the invention is the application, in at least one detection phase in a measurement sequence, of at least one shift gradient in the slice direction.

A method for recording a magnetic resonance data record, also referred to as a measurement sequence, basically is composed of three phases: an excitation phase, an evolution phase, and a detection phase.

During the excitation phase, preparation modules can be used. This phase concludes with the final RF pulse for excitation. In a spin echo, the excitation phase includes only the 90° pulse, in a FLASH it includes the RF pulse.

In a preferred embodiment, the excitation phase features the application of an excitation pulse, in particular a single excitation pulse. This pulse can excite a 2D slice, multiple slices or a 3D volume.

In an embodiment, the excitation pulse can be fashioned as a multi-band pulse, in particular as a dual-band pulse. The excitation pulse can then excite two or more slices simultaneously. During application of the excitation pulse, a slice-selection gradient can in a preferred embodiment be applied simultaneously. This is possible independently of the pulse form.

The slices that are acquired simultaneously are parallel to each other, i.e. they do not intersect.

In the evolution phase, there can be, for example, at least one slice-rephasing gradient and/or at least one phase-encoding gradient and/or at least one read-dephasing gradient and/or at least one refocusing pulse, etc.

In the detection phase in imaging sequences, read gradients are usually applied, and the acquisition window is also open.

In a sequence, an excitation phase can also be followed by multiple evolution and detection phases, as is the case for example in FSE. Otherwise, the phases are repeated until all the measurement signals have been recorded.

The sequence of steps also determines the time sequence of the procedure. I.e. the shift gradient is applied only after the readout of the first echo signal. This does not, however, make it necessary to repeat all the steps in each sub-experiment, this sequence must occur at least once during implementation of the method. Also, virtually any measures can take place in the evolution phase. These can also differ from sub-experiment to sub-experiment. For example, the phase gradient has different values depending on the time of the measurement.

It is crucial that in the detection phase at least two echoes are recorded and after the first echo at least one shift gradient is applied in the slice-selection direction. This causes a shift of the further images calculated from the measurement data relative to the first images. There are always at least two first images, as measurement signals are acquired from at least two slices. Correspondingly, there are also at least two further images.

The measurement signals are fashioned as echo signals. FIDs, as possible in spectroscopy sequences, are not acquired.

As the invention can be used in different measurement sequences, the following definitions apply:

Measurement sequence is the term used to designate, as is customary, a sequence of RF pulses, gradient fields, waiting times and acquisition windows which precisely define and characterize the measurement sequence procedure. Examples of measurement sequences include the previously mentioned FLASH, spin echo, gradient echo, FSE, EPI and TrueFisp. These image data records determined therefrom can also, due to preparation modules, have weightings or be suitable for generating maps such as T1 maps or T2 maps.

A measurement sequence is composed of defined or definable sub-experiments. A sub-experiment can also be referred to as an excitation cycle. In a spin echo, as many excitation pulses are applied as phase-encoding steps are implemented. Correspondingly, there are as many excitation cycles as there are phase-encoding steps.

In a fast spin echo, multiple refocusing pulses are used, which is why the term echo train is used.

In the present invention, a differentiation is made between an echo train due to multiple refocusing pulses and a gradient echo train due to read gradients, in particular bipolar read gradients. In a fast spin echo with 128 phase-encoding steps and a total of 8 echoes in an echo train, a total of just 16 excitation cycles is required for recording a full measurement data record.

The length of an excitation cycle is called the repetition time and is abbreviated "TR".

In an echo train, the time between two echoes is called the inter-echo time and is abbreviated "TI".

The echo time is abbreviated "TE".

These definitions are consistent with existing conventions among those skilled in the field of MR imaging.

In a spin echo, a measurement sequence according to the invention thus has at least two read gradients in an excitation cycle, while in an FSE at least two read gradients occur in an echo train. To be more precise, the read gradients are each to be found in the detection phase.

Between the excitation pulse and the refocusing pulse, a phase-encoding gradient and/or a dephasing-read gradient can be applied. However, these can also be applied separately or both after the refocusing pulse. This sometimes depends on the measurement sequence used and sometimes on the constraints of the experiment.

When multiple coils are used in the recording of MR data, only a part of a complete set of k-space data are recorded by each coil. The missing data can be calculated using the methods such as GRAPPA and SENSE described above.

In a preferred embodiment, the shift gradient can be applied only in every nth excitation cycle and/or every nth detection phase, where n is a natural number greater than 1. The shift gradient is thus not applied in every detection phase, but only in every nth detection phase. The strength of the shift can be influenced in this way.

In a preferred embodiment, the shift gradient can have the same gradient moment when applied multiple times in different and/or the same excitation cycles. The shift gradient can also have the same gradient moment when applied multiple times in different detection phases. An excitation cycle can have, for example in the case of an FSE, multiple detection phases and thus also multiple shift gradients, even if the shift gradient is not applied in every detection phase. The gradient moment is the same if the time integral over the gradient amplitude is the same. In this embodiment, too, the shift gradient is not necessarily applied in every detection phase. However, if the shift gradient is applied, then it is with a gradient moment that is always the same.

In an embodiment, steps b) to c4) can be performed multiple times in an excitation cycle. In other words, the evolution phase and the detection phase are repeated. Accordingly, the measurement sequence can be embodied as an FSE.

In a preferred embodiment, the evolution phase can have at least one, in particular precisely one, refocusing pulse. The measurement sequence is then embodied as a spin echo or FSE. The echo train in an FSE is the result of multiple occurrence of the evolution phase. The detection phase then also occurs multiple times in relation to a single excitation phase in an excitation cycle, as described previously.

In a preferred embodiment, a second read gradient and a third read gradient can be applied as further read gradients and a second echo signal and a third echo signal can be read out.

In a preferred embodiment, each detection phase has precisely three read gradients. The shift gradient can be applied between the first and the second or the second and the third read gradient or echo signal. In the first case, the last two image data records are shifted relative to the first; in the second case, only the last is shifted relative to the first and second image data records.

In another embodiment, two shift gradients can be applied, one causing a shift of the second image data records generated from second echo signals relative to the first image data records generated from first echo signals, and the second shift gradient causing a shift of the third image data records generated from third echo signals relative to the second image data records generated from second echo signals. The use of two shift gradients in a detection phase enables a further improved reconstruction.

The statements regarding the first shift gradient also basically apply where two shift gradients are used. These can also each have intrinsically the same gradient moments, be applied only in every nth excitation cycle or every nth detection phase, etc.

The gradient moment of the second shift gradient can have a fixed ratio relative to the first shift gradient. In particular, it can be twice or half as large. Furthermore, the application cycles can differ. Thus, the first shift gradient can be applied in every second detection phase and the second shift gradient in every third detection phase. Gradient moment and/or application cycle can, however, in each case also be identical.

The gradient moment of the shift gradient or gradients can in particular be an mth part of the gradient moment of the slice-selection gradient, where m is a natural number greater than 1. The ratio of the gradient moment of the slice-selection gradient to the gradient moment of the shift gradient is thus a natural number greater than 1.

In another embodiment, the shift gradient, in particular the first shift gradient, can be activated simultaneously with the end gradient ramp of the first read gradient and/or with the start gradient ramp of the second read gradient. This enables incorporation in the measurement sequence without changing the timing in the detection phase. One or two gradient ramp times, which are present anyway for the activation of the read gradients, can be used. As the acquisition windows are already closed or are not yet open at this time, the recording is not affected either.

In a preferred embodiment, the first shift gradient or the second shift gradient can be activated simultaneously with the end gradient ramp of the second read gradient and/or the start gradient ramp of the third read gradient. If only one shift gradient is used, this can be applied, as already described above, before the second echo signal or before the third echo signal. If two shift gradients are used, the first shift gradient is located before the second echo signal and the second shift gradient before the third echo signal.

In a preferred embodiment, the echo signals influenced by at least one of the shift gradients and the first echo signal can have the same phase-encoding.

In principle, there can also be further echo signals. However, in a 2-point or 3-point Dixon method with FSE, further echo signals are disadvantageous, as they extend the echo time and the inter-echo time and thereby make the SNR worse. Second and third echo signals are then those echo signals which are influenced by the shift gradient or gradients.

In principle, the echo signals can be contained in a gradient echo train. The procedure described can therefore be used in sequences such as spin echo, fast spin echo, GRASE, a fast spin echo-based 2-point Dixon technique, a fast spin echo-based 3-point Dixon technique, etc.

A body coil or a coil array can be used for radiating the excitation pulse and/or the refocusing pulses. The gradient echoes are read out as echo signals by means of a coil array.

In another embodiment, steps b) to c4) can be performed multiple times in an excitation cycle. Multiple refocusing pulses are thus used for generating an echo train. The number of echo signals which can actually be recorded is then at least twice as great as the number of echoes in the echo train, as at least two gradient echoes are always generated in an echo train.

Steps c) to c4) can be performed within an inter-echo period, i.e. between two or after the last refocusing pulse. In other words, the first, second and third echo signals of a k-space line are received in a single detection phase.

In another embodiment, a further shift gradient in the slice-selection direction can be applied before the first read gradient. This further shift gradient, for example, can be added to or subtracted from a spoiler gradient. It is consequently applied in the evolution phase. Depending on the number of shift gradients in the detection phase, this will be the second or third shift gradient in the slice-selection direction. In terms of magnitude, this can have the same gradient moment as one of the other shift gradients.

In a preferred embodiment, at least one phase-shift gradient can be applied in the detection phase. All embodiments with regard to the shift gradient apply analogously:

In another embodiment, the phase shift gradient can cause a constant jump in k-space in different excitation cycles and/or sections of an echo train. Alternatively or additionally, the phase shift gradient can cause a different jump in k-space in different excitation cycles and/or detection phases. Here, the gradient moment can change from excitation cycle to excitation cycle but be the same for all detection phases or vice versa.

In another embodiment, water protons and fat protons can have an opposite phase during the first echo. This relative position is also referred to as an "opposed phase" or "out of phase". Particularly in the 2-point Dixon method, the echo time of the first echo signal can be chosen so that this is the case.

In a preferred embodiment, water protons and fat protons can have the same phase during a second echo signal.

Furthermore, water protons and fat protons can have an opposed phase during the third echo signal.

In a preferred embodiment, the second shift gradient can a gradient moment which is equal in magnitude to that of the first shift gradient, but of opposite sign. I.e. the second shift gradient reverses the effect of the first shift gradient.

The phase-shift gradient can then be used either in order to be able to use the k-space lines of the third image data records to supplement the first image data records or in order to encode a navigator image.

With the first and second echo signals, data can then be collected for a 2-point Dixon method, and with the third echo signals, a navigator image or calibration data for the reconstruction.

If the navigator echo signals are recorded as third echo signals in the gradient echo train and further echo signals as a fourth gradient echo, the further echo signals can be "in phase" and supplement the k-space data of the in-phase image, i.e. the image with the second gradient echoes or echo signals.

In a preferred embodiment, bipolar gradients can be used as read gradients. These therefore switch their polarity. This is normal in the generation of a gradient echo train.

In an advantageous embodiment, a fast spin echo (FSE) can be used as a measurement sequence. If there are three echo signals in a gradient echo train and eight echoes in an echo train, twenty-four echo signals are acquired in an excitation cycle.

In another embodiment, precisely three echo signals can be recorded in a gradient echo train. With this number, the inter-echo time is increased only slightly, but a lot of information is obtained.

In another embodiment, after the third read gradient a further gradient can be applied in the phase direction, this further gradient at least partially offsetting the phase-shift gradient. These gradients are also called phase-rewind gradients.

In a preferred embodiment, a slice-selection gradient can be applied simultaneously with the excitation pulse and/or refocusing pulse or pulses respectively. This enables slice-selective excitation of the spins.

In a preferred embodiment, a phase-rewind gradient can be applied after the last echo signal has been read out in a detection phase. This gradient is designed to move the magnetization back to the center of k-space.

The present invention also encompasses a non-transitory, computer-readable data storage medium encoded with programming instructions, the storage medium being loaded into a computer or computer system of a magnetic resonance apparatus, and the programming instructions causing the computer or computer system to operate the magnetic resonance apparatus so as to implement any or all embodiments of the method according to the invention, as described above.

The present invention also encompasses a magnetic resonance apparatus having an MR data acquisition scanner operated by a computer or computer system, wherein the computer or computer system is configured so as to operate the MR data acquisition scanner so as to implement any or all embodiments of the method according to the invention, as described above.

The above-mentioned methods can be implemented in the control computer as software or as (hard-wired) hardware.

DESCRIPTION OF THE PREFERRED EMBODIMENTS

Figure 1:
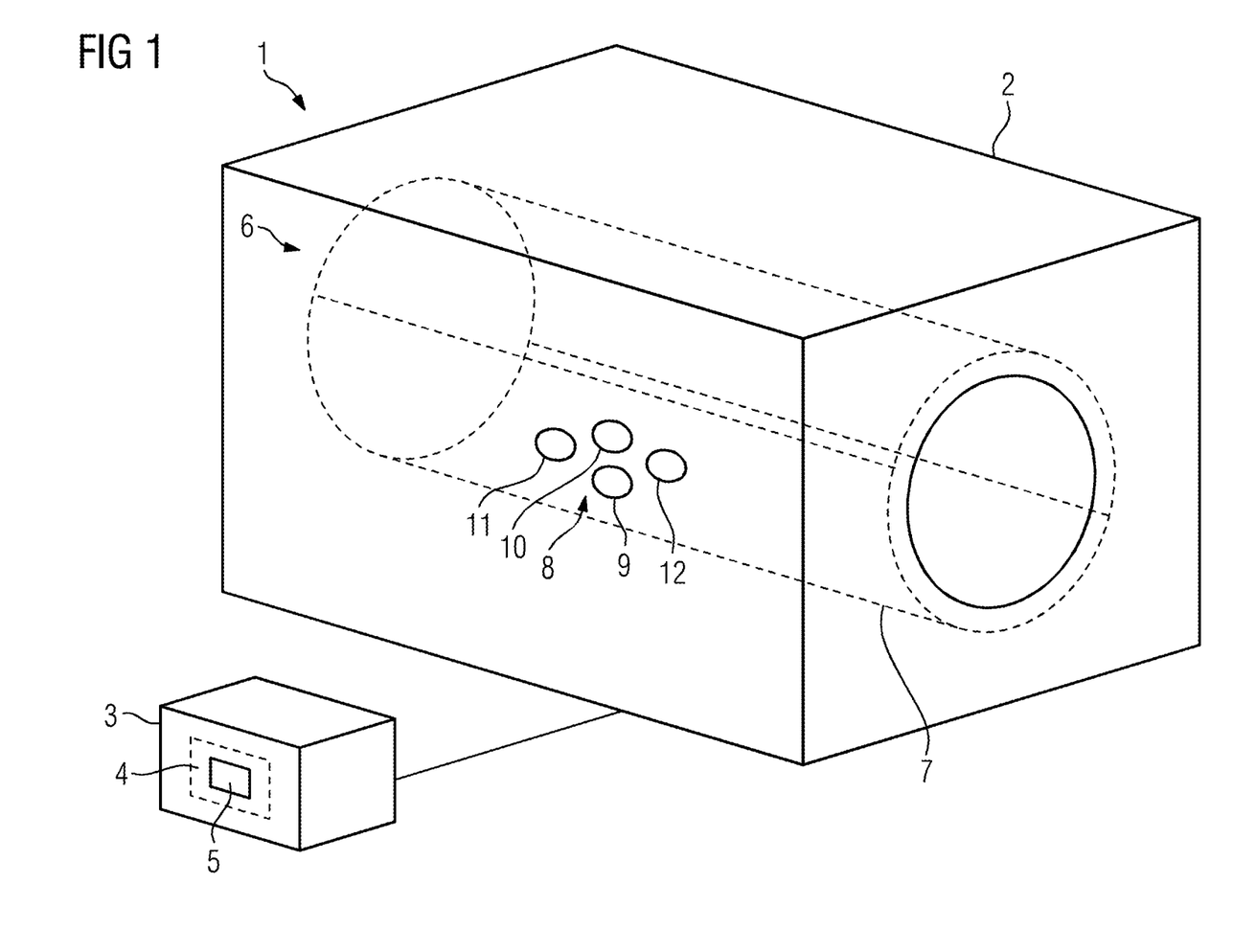
FIG. 1 schematically illustrates a magnetic resonance system in accordance with the invention.

FIG. 1 shows a magnetic resonance system 1. This has, as the major components shown, a magnetic resonance scanner 2 and a control computer 3.

The control computer 3 has a non-transitory data medium 4 with program code 5 stored thereon. Measurement sequences are executed according to the program code 5.

A transmitter coil arrangement 6 is situated in the magnetic resonance scanner 2. The transmitter coil arrangement 6 is usually embodied as a body coil 7. Thus, it is formed by a single coil.

A receiver coil arrangement is also present. This is fashioned as a coil array 8 with coils 9, 10, 11 and 12. To help differentiate between them, the transmitter coil arrangement 6 is represented by dashed lines.

The coil array 8 is used only for reading out the measurement signal. The coils 9, 10, 11 and 12 of the coil array 8 acquire the measurement signals simultaneously.

For clarity, further known components of the magnetic resonance system 1, such as gradient coils and a patient table, are not shown.

Figure 2:
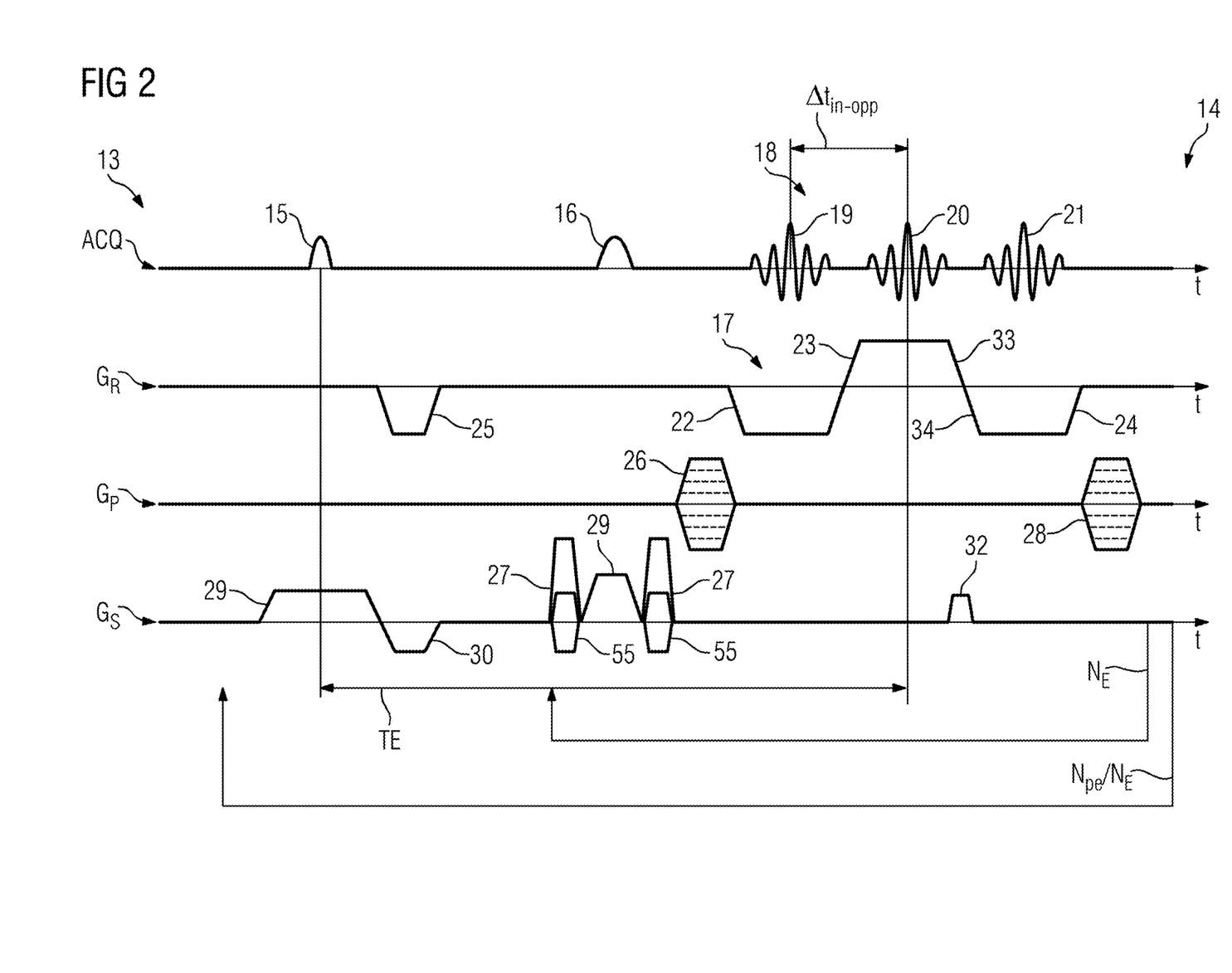
FIG. 2 shows a measurement in accordance with the invention sequence in a first embodiment.

FIG. 2 shows a sequence diagram 13 of an FSE measurement sequence 14 relating to a first embodiment of the invention. By means of the measurement sequence 14, two slices can be measured simultaneously.

To this end, at least the excitation pulse 15 is a dual-band pulse. The excitation pulse 15 turns the magnetization through 90° out of the longitudinal direction into the transverse plane. The refocusing pulse 16, on the other hand, has a flip angle of 180°.

The gradient echo train 17 generates an echo signal train 18 with three echo signals 19, 20 and 21. The middle echo signal 20 is simultaneously a gradient echo and a spin echo, as is customary in spin-echo-based sequences. This is generated by the sequence of excitation pulse 15 and refocusing pulse 16 or refocusing pulses 16. How many refocusing pulses 16 precede a spin echo will depend on which echo signal train of the echo train of an FSE is under consideration.

The middle echo signal 20 is that signal whose middle defines the echo time TE.

$\Delta t_{in\text{-}opp}$ designates the time interval between an "in phase" and an "opposed phase" arrangement of water and fat protons.

Each of the echo signals 19, 20 and 21 has signals from two slices. More slices can also be acquired simultaneously, the excitation pulse 15 must have a corresponding number of bands.

The read gradients 22, 23 and 24 of the gradient train 17 are set such that in the case of the echo signal 19 water protons and fat protons from the examination area are arranged out of phase, in the case of the echo signal 20 in phase and in the case of the echo signal 21 out of phase again.

The echo signals 19 and 20 can therefore be used to implement a 2-point Dixon method. Separate water and fat images can thus be calculated from the echo signals 19 and 20.

The echo signals 19, 20 and 21 are acquired with the coil array 8. As a result, the slices excited with the excitation pulse 15 fashioned as a dual-band pulse can also be unfolded. The method described is consequently a method for parallel imaging. In contrast to imaging with a single detection coil, fewer phase-encoding steps are then used. The phase-encoding steps are abbreviated $N_{pe}$ in the sequence diagram 13. $N_{pe}$ stands here for "number of phase-encoding steps". $N_E$ designates the number of echoes of the echo train of the measurement sequence 14. The number of excitation cycles is therefore given by $N_{pe}/N_E$.

In addition to the read gradients 22, 23 and 24, the measurement sequence 14 also has in the read direction $G_R$ a read-dephasing gradient 25. Its moment is normally half as large as the moment generated by one of the read gradients 22, 23 or 24.

The read gradients 22, 23 and 24 are bipolar, i.e., their polarity alternates.

A phase-encoding gradient 26 and a phase-rewind gradient 28 are applied in the phase direction $G_P$. The phase-rewind gradient 28 offsets the phase-encoding gradient 26 such that the total phase in the phase direction between two excitation pulses 15 is equal to zero. This is known from FSE measurement sequences.

In the slice direction $G_S$, there is also a shift gradient 32 in addition to the slice-selection gradients 29 and 30 and the slice-rephasing gradient 31.

In addition, the refocusing pulse 15 is surrounded by spoiler gradients 27.

The shift gradient 32 occurs after the second echo signal 20. To be more precise, it occurs simultaneously with the end gradient ramp 33 of the second read gradient 23 and with the start gradient ramp 34 of the third read gradient 24. As a result, the shift gradient 32 can be incorporated in the measurement sequence 14 without shifting the times of the echo signals 19, 20 and 21.

The shift gradient 32 causes at this point a shift of the images which are determined from the echo signals 21 relative to the images which are calculated from the echo signals 19 and 20.

The shift gradient 32 is not applied in every detection phase 35, but only in every second detection phase.

The shift gradient 32 follows gradients 55 in the slice-selection direction $G_S$. The gradients 55 are blipped CAIPIRINHA gradients and provide improved unfolding in multislice experiments in parallel imaging. A gradient 55 has in most cases the same moment in terms of magnitude as the shift gradient 32, and either the same or an opposite polarity. In terms of magnitude, the gradient 55 does not necessarily have to be equal in size to the shift gradient 32; that is the case when FOV shift factors not equal to 2 are to be used. The gradients 55 are respectively arranged in a positive and a negative direction and are applied simultaneously with the spoiler gradients 27. In practice, the gradient moment of the Gradient 55 is added to or subtracted from that of the spoiler gradient 27 and a single gradient is applied.

If the shift gradient 32 is applied, either the first or the second gradient 55 can be omitted. The applied gradient 55 can be applied like the shift gradient, i.e. only in every second excitation cycle.

The interaction of the gradient 55 and of the shift gradient 32 gives rise to the sampling pattern shown in the figures described below.

Figure 3:
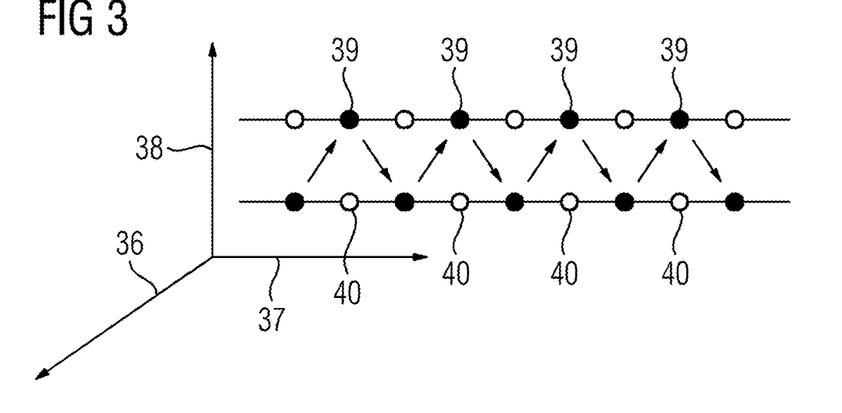
FIG. 3 shows a first k-space sampling pattern for the measurement sequence according to FIG. 2.
Figure 4:
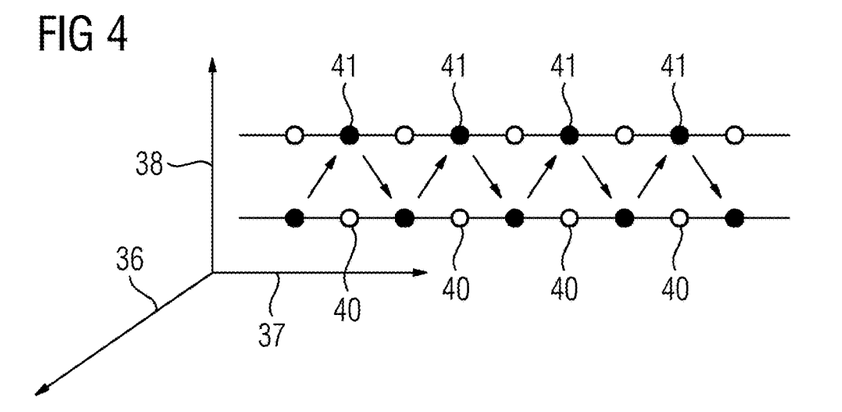
FIG. 4 shows a second k-space sampling pattern for the measurement sequence according to FIG. 2.
Figure 5:
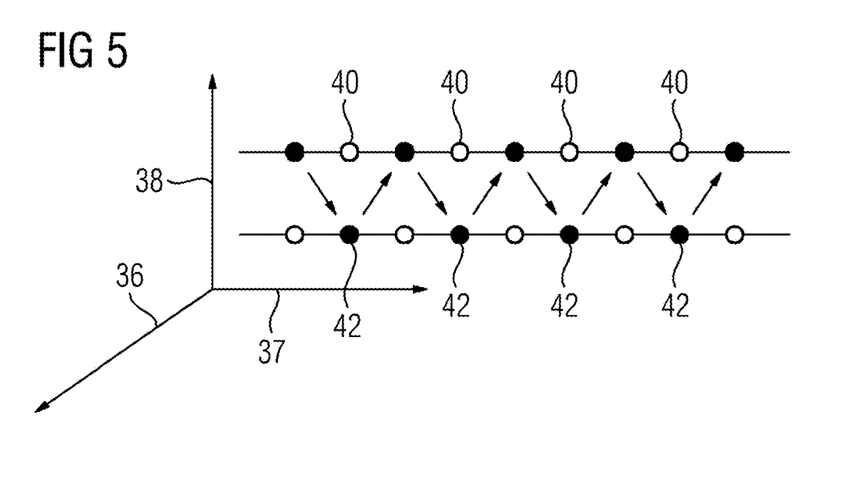
FIG. 5 shows a third k-space sampling pattern for the measurement sequence according to FIG. 2.

FIGS. 3 to 5 show the sampling of the k-spaces for the echo signals 19, 20 and 21. In all the figures of this kind described below, the acquired k-space lines are shown filled black and the omitted k-space lines are shown filled white.

FIG. 3 shows the sampling of the k-space for the echo signal 19. As also in the Figures below, the axis 36 shows the $k_x$ direction, the axis 37 the $k_y$ direction and the axis 38 the $k_z$ direction. The acquired k-space lines 39 are shown circle-shaped in cross section, as in the chosen representation they proceed into the page. The circles 40 filled white show omitted k-space lines.

FIG. 4 shows the acquired k-space lines 41 of the echo signal 20. These are arranged identically to FIG. 3.

The recorded k-space lines 42 of the echo signal 21 in FIG. 5, are shifted in the z-direction. This is caused by the shift gradient, as the remaining signal encoding stays the same.

Figure 6:
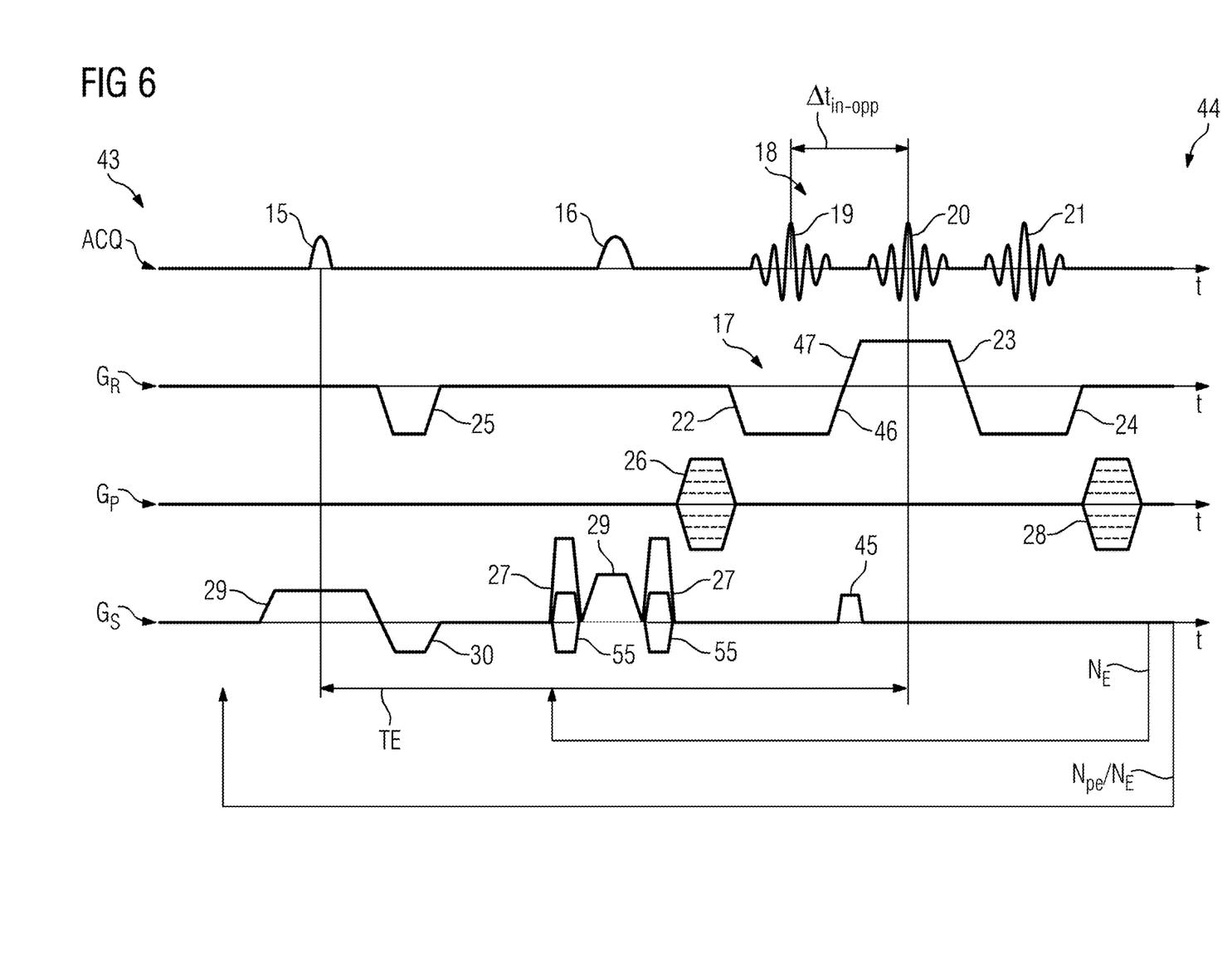
FIG. 6 shows a measurement sequence in accordance with the invention in a second embodiment.

FIG. 6 shows a sequence diagram 43 of a measurement sequence 44. The measurement sequence is largely identical to the measurement sequence 14 in FIG. 2. The statements regarding identical elements apply likewise to these elements in FIG. 6.

The only difference in relation to FIG. 2 is that the shift gradient 45 is applied directly after the first echo signal 19 and is thus being applied at the same time as the end gradient ramp 46 of the first read gradient 22 and the start gradient ramp 47 of the second read gradient 23.

The shift gradient 45 consequently acts upon the two echo signals 20 and 21.

Figure 7:
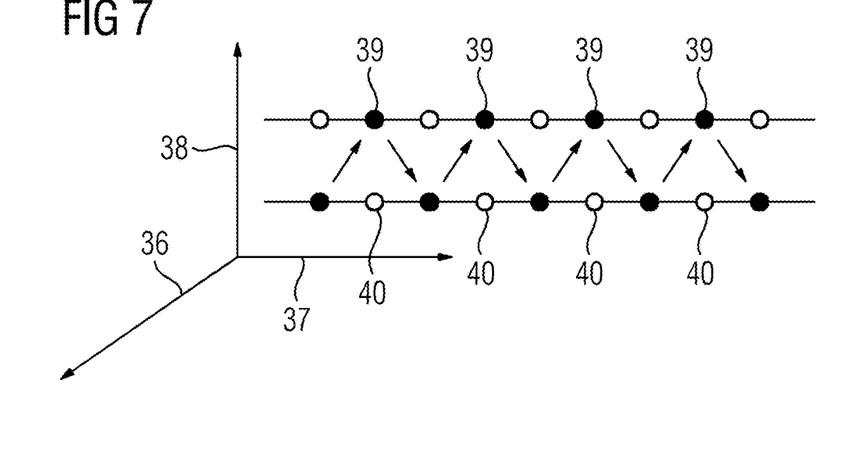
FIG. 7 shows a first k-space sampling pattern for the measurement sequence according to FIG. 6.
Figure 8:
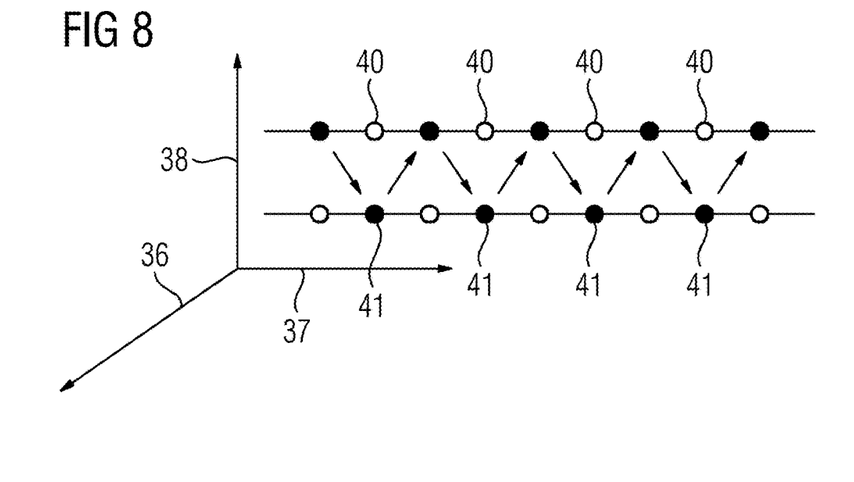
FIG. 8 shows a second k-space sampling pattern for the measurement sequence according to FIG. 6.
Figure 9:
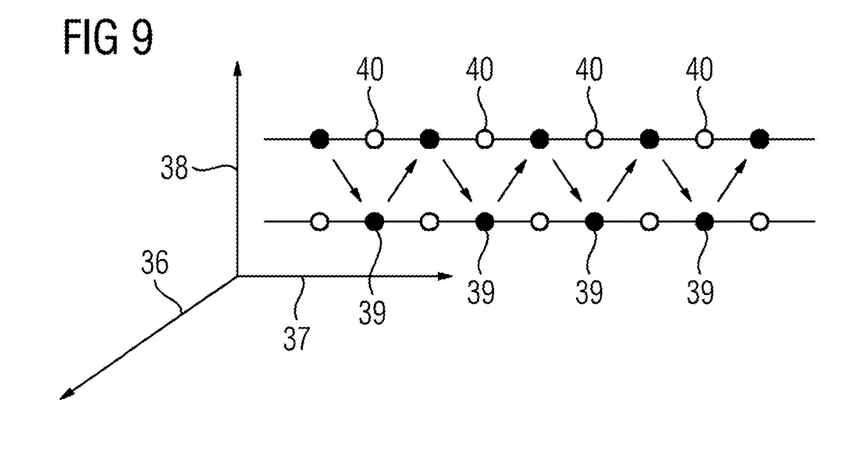
FIG. 9 shows a third k-space sampling pattern for the measurement sequence according to FIG. 6.

FIGS. 7 to 9 show the sampling of respective k-spaces relating to the echo signals 19, 20 and 21 for the measurement sequence 44 in FIG. 6.

FIG. 7 is identical to FIG. 3, as the encoding with regard to the echo signal 19 has not changed.

FIG. 8 shows a difference from FIG. 4, which both relate to the echo signal 20. In FIG. 8, the sampling is as in FIG. 5. This stems from the fact that the shift gradient 45 influences both the echo signal 20 and the echo signal 21.

Accordingly, FIGS. 5 and 9 are also identical, as the shift gradient 32 or 45 acts upon the echo signal 21 both in the measurement sequence 14 and in the measurement sequence 44.

Figure 10:
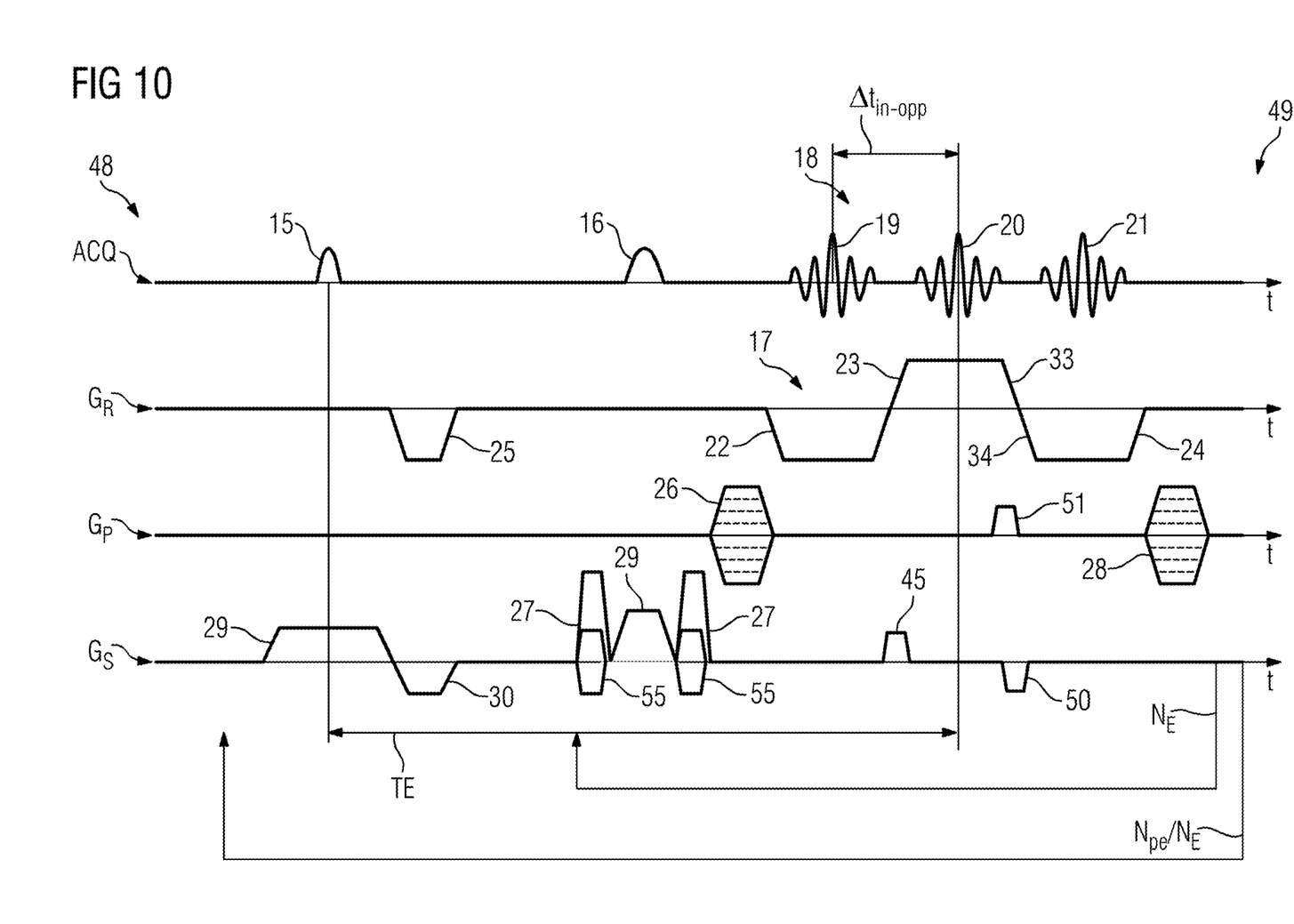
FIG. 10 shows a measurement sequence in accordance with the invention in a third embodiment.

FIG. 10 shows a sequence diagram 48 of a measurement sequence 49. The measurement sequence 49 differs from the measurement sequences 14 and 44 in that two shift gradients 45 and 50 are used. In the embodiment according to FIG. 10, the shift gradient 50 counteracts the effect of the shift gradient 45 with respect to the echo signal 21. However, the shift gradient 50 can alternatively also be chosen such that it causes a further shift of the echo signal 21 both relative to the echo signal 19 and relative to the echo signal 20. The shift gradients 45 and 50 have the same gradient moment when applied over all the detection phases.

In addition, a further optional embodiment available is a phase-shift gradient 51. This is fashioned such that it shifts the k-space in the $k_y$ direction by a line.

Consequently, in the embodiment according to FIG. 10, the shift gradient 45 effectively acts only upon the echo signal 20. Also, the phase-shift gradient 51 acts in the first detection phase only upon the echo signal 21.

The phase-rewind gradient 28 is then adapted by the gradient moment such that the overall gradient moment in the phase direction is zero again.

Figure 11:
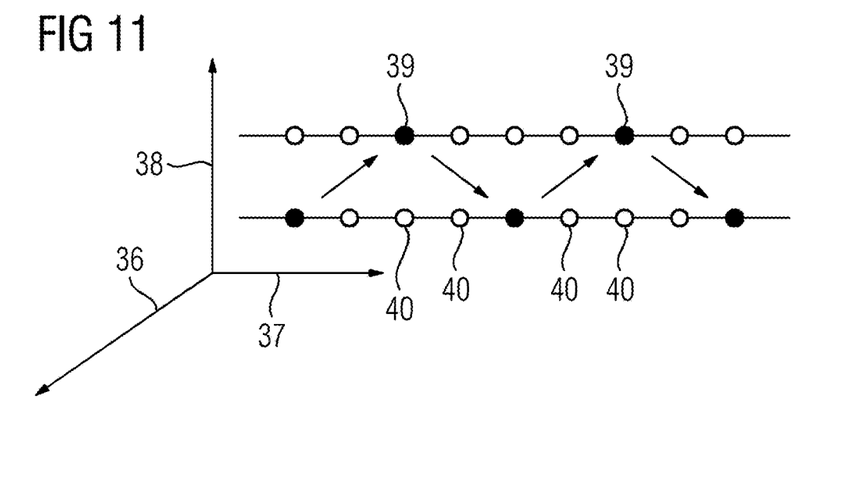
FIG. 11 shows a first k-space sampling pattern for the measurement sequence according to FIG. 10.
Figure 12:
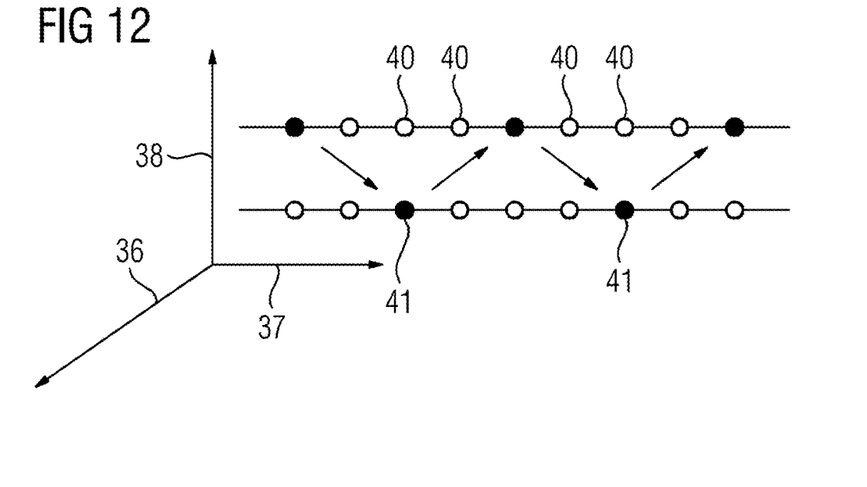
FIG. 12 shows a second k-space sampling pattern for the measurement sequence according to FIG. 10.
Figure 13:
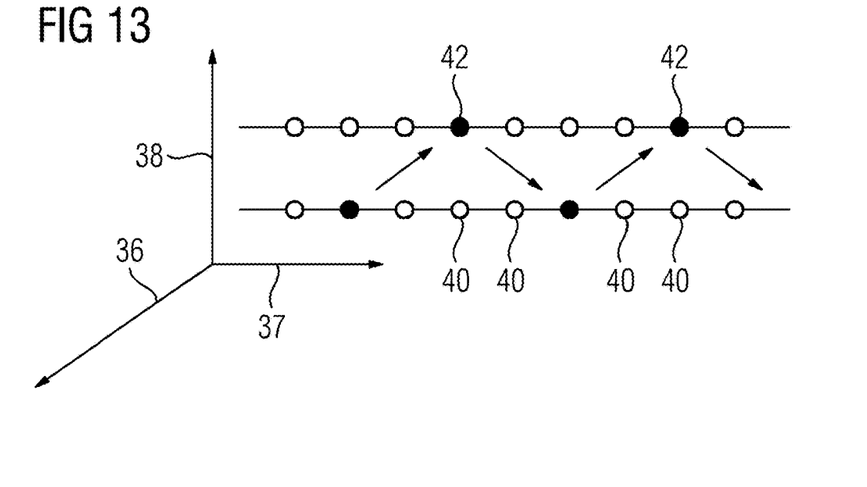
FIG. 13 shows a third k-space sampling pattern for the measurement sequence according to FIG. 10.

FIGS. 11 to 13 show the sampling of the k-spaces relating to the echo signals 19, 20 and 21 for the measurement sequence 49 in FIG. 10.

Whereas in FIGS. 11 and 12 the shift gradient 51 is not apparent, in FIG. 13 the first $k_y$ line is omitted. This is due to the shift gradient 51.

The shift gradient 45, on the other hand, shows effects only in FIG. 12, since, as described, its effect with respect to the echo signal 21 which is shown in FIG. 13 is counteracted by the shift gradient 50.

Figure 14:
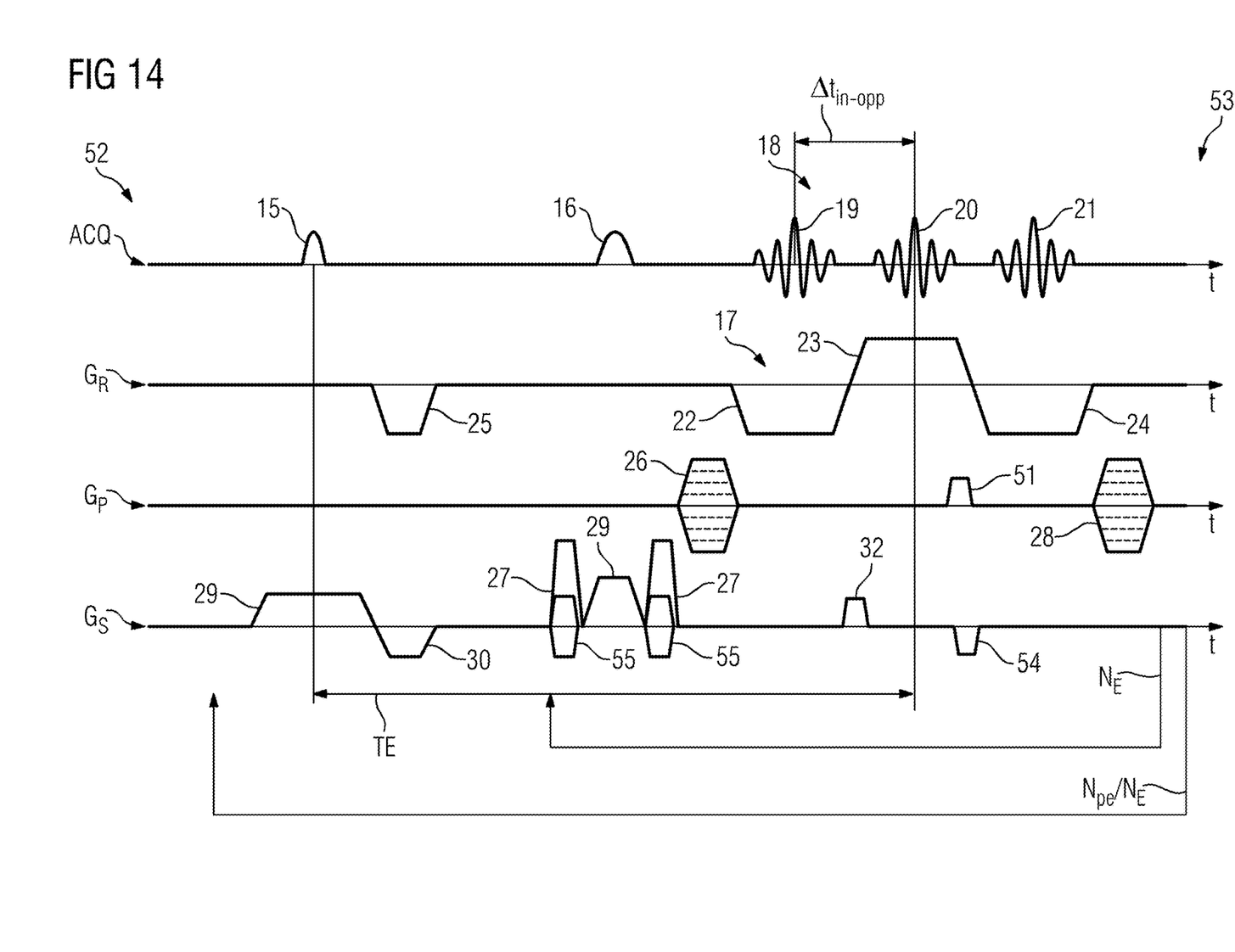
FIG. 14 shows a measurement sequence in accordance with the invention in a fourth embodiment.

FIG. 14 shows a sequence diagram 52 of a measurement sequence 53. This has essentially the same components as the measurement sequences 14, 44 and 49. In contrast to measurement sequence 49, the second shift gradient 54 in the slice direction $G_S$ is variable. Similarly, the shift gradient 51 can basically be used variably, i.e. it can have different gradient moments in different detection phases.

Figure 15:
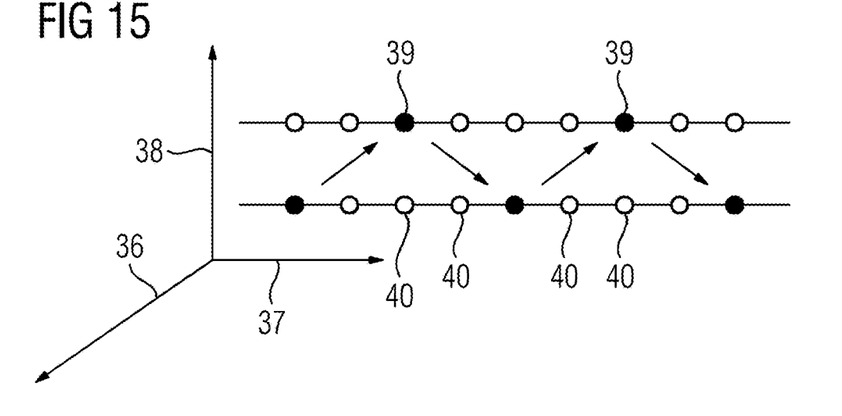
FIG. 15 shows a first k-space sampling pattern for the measurement sequence according to FIG. 14.
Figure 16:
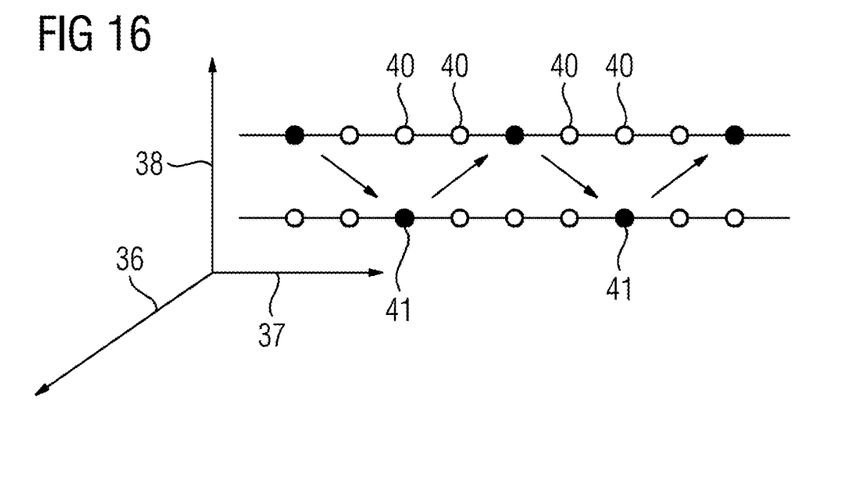
FIG. 16 shows a second k-space sampling pattern for the measurement sequence according to FIG. 14.
Figure 17:
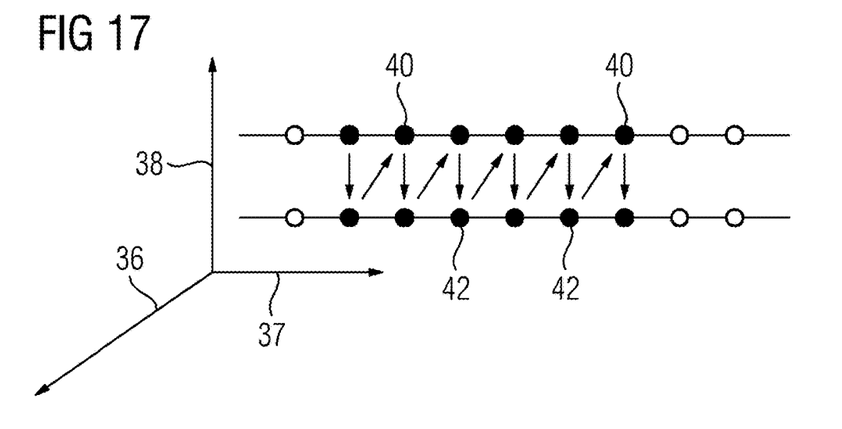
FIG. 17 shows a third k-space sampling pattern for the measurement sequence according to FIG. 14.

This results in the samplings shown in FIGS. 15 to 17 for measurement sequence 53. The sampling of the echo signal 19 in FIG. 15 corresponds to that of FIG. 11. The sampling of the echo signal 20 in FIG. 16 corresponds to that of FIG. 12.

However, the sampling of the echo signal 21 proceeds differently from the previous samplings. For example, a sampling as shown in FIG. 17 can occur. The echo signals 19 and 21 can supplement one another such that a complete k-space is sampled. This supplementary data can be used, for example, as calibration data for a GRAPPA reconstruction.

The measurement sequences 14, 44, 49 and 53 all show a FSE sequence with a gradient echo train 17, the first and third echo signals 19 and 21 being recorded out of phase and the second echo signals 20 being recorded in phase. Depending on the gradient echo train, a dual-band pulse is used as the excitation pulse in order to record two measurement slices simultaneously.

The application of the shift gradients 32, 45, 50, 51 and 54 can also be applied in other sequences which have at least one gradient echo train with two echoes.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for recording a magnetic resonance (MR) data record using multiple radio-frequency (RF) reception coils of an MR scanner, wherein measurement signals of the MR data record contain measurement signals of at least two image data records respectively from at least two slices of a subject, comprising operating said MR scanner to execute a measurement sequence comprising:
   a) an excitation phase;
   b) an evolution phase;
   c) a detection phase comprising:
      c1) readout of a first echo signal of a first image data record with said multiple RF coils while a first read gradient is applied, the first echo signal occurring at the first echo time,
      c2) application of at least one shift gradient in a slice-selection direction, and
      c3) readout of at least one further echo signal of a further image data record with said multiple RF coils while a further read gradient is applied, the at least one further echo signal occurring at a respective further echo time different from the first echo time, wherein
      c4) the shift gradient is positioned to cause a shift of at least one further image data record generated from the further echo signal or signals relative to the first image data record generated from first echo signals.

2. The method as claimed in claim 1, comprising applying the shift gradient only in every nth excitation cycle and/or in every nth detection phase, where n is a natural number greater than 1.

3. The method as claimed in claim 1 comprising applying the shift gradient with a same gradient moment when applied multiple times in different excitation cycles and/or in the same excitation cycles.

4. The method as claimed in claim 1, comprising performing steps b) to c4) are multiple times in an excitation cycle.

5. The method as claimed in claim 1, comprising applying a second read gradient and a third read gradient as further read gradients and reading out a second echo signal and a third echo signal.

6. The method as claimed in claim 5, comprising applying two shift gradients, wherein the first shift gradient causes a shift of the second image data record generated from second echo signals relative to the first image data record generated from first echo signals, and the second shift gradient causes a shift of the third image data record generated from third echo signals relative to the second image data record generated from second echo signals.

7. The method as claimed in claim 6, comprising applying the first shift gradient simultaneously with an end gradient ramp of the first read gradient and/or a start gradient ramp of the second read gradient.

8. The method as claimed in claim 6, comprising applying the second shift gradient simultaneously with an end gradient ramp of the second read gradient and/or a start gradient ramp of the third read gradient.

9. The method as claimed in claim 1, wherein water protons and fat protons are in-phase and/or out-of-phase during the readout of the echo signals.

10. The method as claimed in claim 1, comprising applying bipolar gradients as said read gradients.

11. The method as claimed in claim 1, comprising operating said MR scanner to execute a fast spin echo as the measurement sequence.

12. The method as claimed in claim 1, comprising recording in a gradient echo train comprising precisely three echo signals.

13. The method as claimed in claim 1, wherein the first image data record is one of an in-phase image data record and an opposed-phase image data record, and the at least one further image data record is the other of the in-phase image data record and the opposed-phase image data record.

14. A non-transitory, computer-readable data storage medium encoded with programming instructions, said storage medium being loaded into a computer of a magnetic resonance (MR) apparatus comprising an MR data acquisition scanner having multiple radio-frequency (RF) reception coils, said programming instructions causing said computer to operate said MR scanner to execute a measurement sequence comprising:

a) an excitation phase;

b) an evolution phase;

c) a detection phase comprising:

c1) readout of a first echo signal of a first image data record with said multiple RF coils while a first read gradient is applied, the first echo signal occurring at a first echo time, c2) application of at least one shift gradient in a slice-selection direction, and c3) readout of at least one further echo signal of a further image data record with said multiple RF coils while a further read gradient is applied, the at least one further echo signal occurring at a respective further echo time different from the first echo time, wherein c4) the shift gradient is positioned to cause a shift of at least one further image data record generated from the further echo signal or signals relative to the first image data record generated from first echo signals.

15. A magnetic resonance (MR) apparatus comprising:

an MR data acquisition scanner;

a computer configured to operate the MR data acquisition scanner so as to acquire MR measurement signals representing at least two image data records respectively from at least two slices of a subject by executing a measurement sequence comprising:

a) an excitation phase;

b) an evolution phase;

c) a detection phase comprising:

c1) readout of a first echo signal of a first image data record with said multiple RF coils while a first read gradient is applied, the first echo signal occurring at a first echo time, c2) application of at least one shift gradient in a slice-selection direction, and c3) readout of at least one further echo signal of a further image data record with said multiple RF coils while a further read gradient is applied, the at least one further echo signal occurring at a respective further echo time different from the first echo time, wherein c4) the shift gradient is positioned to cause a shift of at least one further image data record generated from the further echo signal or signals relative to the first image data record generated from first echo signals.

* * * * *